United States Patent [19]

Yonemizu et al.

[11] Patent Number: 5,858,112

[45] Date of Patent: Jan. 12, 1999

[54] METHOD FOR CLEANING SUBSTRATES

[75] Inventors: Akira Yonemizu; Masami Akimoto, both of Kumamoto, Japan

[73] Assignee: Tokyo Electron Limited, Tokyo, Japan

[21] Appl. No.: 818,880

[22] Filed: Mar. 17, 1997

Related U.S. Application Data

[62] Division of Ser. No. 587,485, Jan. 17, 1996, Pat. No. 5,651,160.

[30] Foreign Application Priority Data

Jan. 19, 1995  [JP]  Japan ................................. 7-024747

[51] Int. Cl.⁶ ............................... B08B 1/00; B08B 1/04; B08B 3/04
[52] U.S. Cl. ................................. 134/6; 134/7; 134/32; 134/33; 134/37; 134/902; 15/21.1; 15/77; 15/88.2; 15/302
[58] Field of Search .............................. 134/6, 7, 32, 33, 134/37, 902; 15/21.1, 77, 88.2, 302

[56] References Cited

U.S. PATENT DOCUMENTS

| | | | |
|---|---|---|---|
| 2,296,156 | 9/1942 | Fuller | 15/77 X |
| 3,803,660 | 4/1974 | Jividen et al. | 15/77 X |
| 4,068,251 | 1/1978 | Schroter et al. | 15/88.2 X |
| 4,935,981 | 6/1990 | Ohtani et al. | 15/88.2 |
| 5,144,711 | 9/1992 | Gill, Jr. | 15/88.2 X |
| 5,345,639 | 9/1994 | Tanoue et al. | 15/77 X |
| 5,351,360 | 10/1994 | Suzuki et al. | 134/902 X |
| 5,361,449 | 11/1994 | Akimoto | 15/302 |
| 5,375,291 | 12/1994 | Tateyama et al. | 134/902 X |
| 5,485,644 | 1/1996 | Shinbara et al. | 134/902 X |

FOREIGN PATENT DOCUMENTS

| | | | |
|---|---|---|---|
| 63-16626 | 1/1988 | Japan | 15/77 |
| 3-274722 | 12/1991 | Japan | 134/902 |
| 5-299400 | 11/1993 | Japan | 134/902 |

*Primary Examiner*—Zeinab El-Arini
*Attorney, Agent, or Firm*—Oblon, Spivak, McClelland, Maier & Neustadt, P.C.

[57] ABSTRACT

A substrate cleaning method in which the substrate is rotated and cleaned utilizing a brush which is brought into contact with the substrate. In accordance with one presently preferred aspect, the substrate is held between a stepped portion and a stopper portion at the fringe of the substrate, thereby preventing movement of the substrate as it is rotated and the brush is brought into contact with the substrate. In accordance with another aspect, a freely rotatable brush is brought into contact with the substrate so that the brush can rotate with the rotating substrate, and damage to the substrate can be minimized.

17 Claims, 7 Drawing Sheets

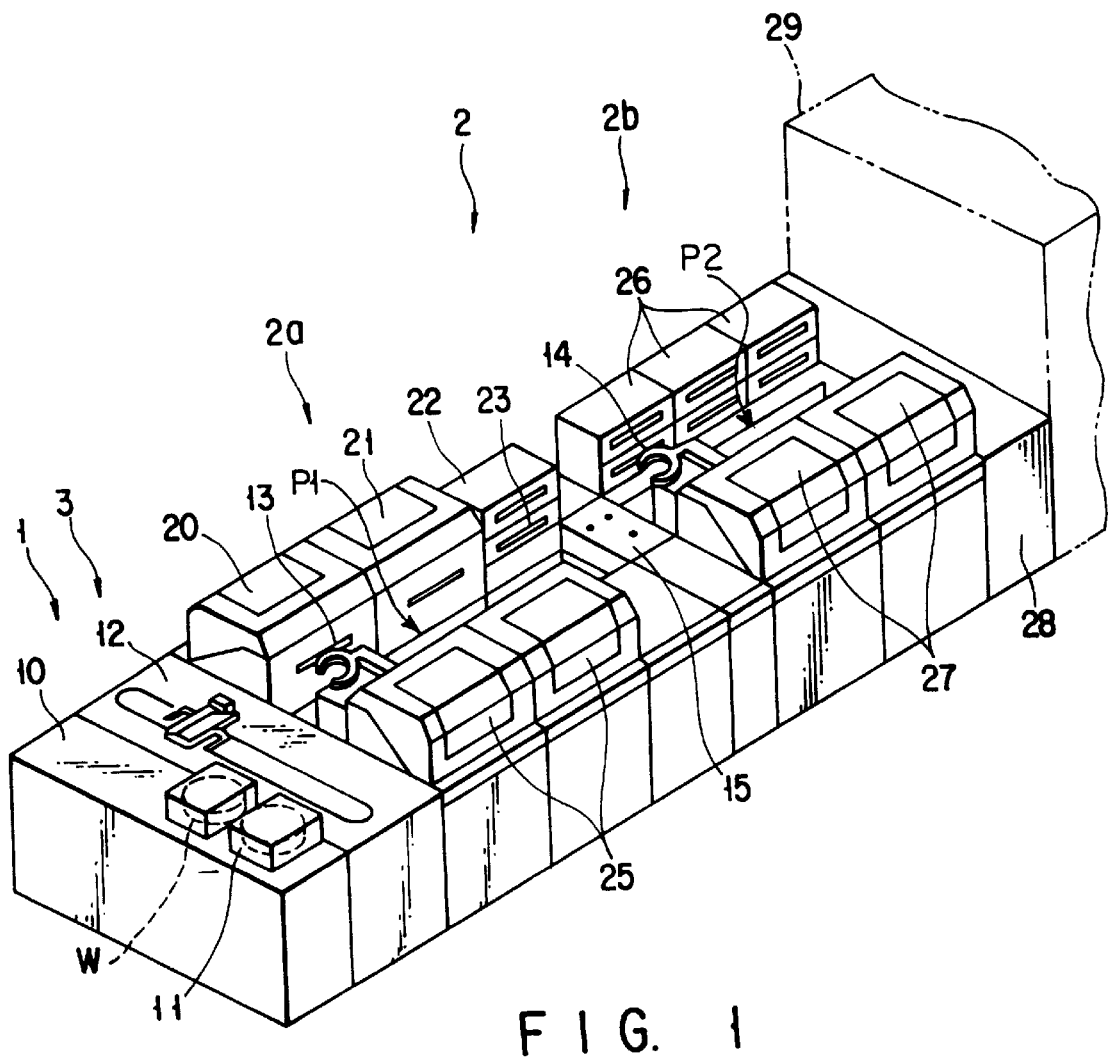
F I G. 1

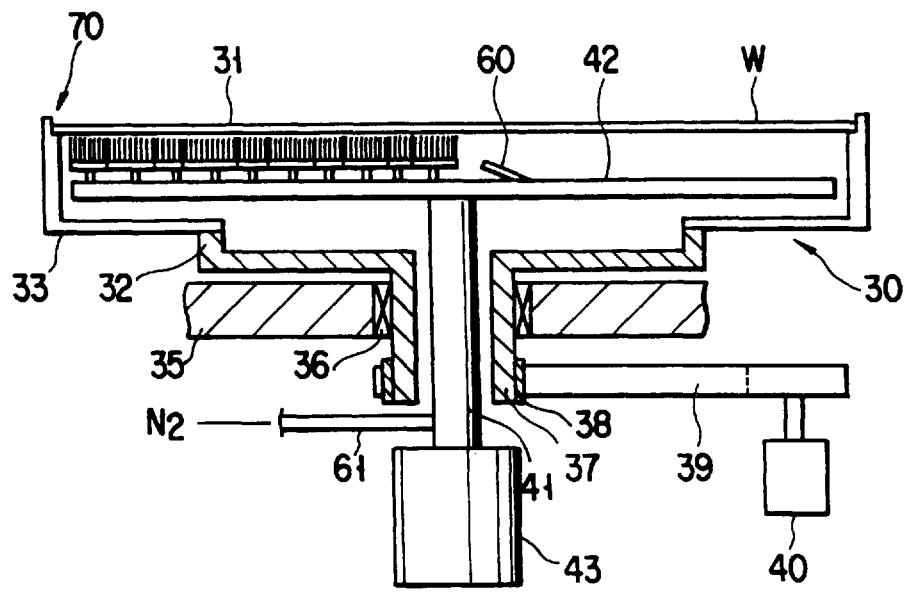
F I G. 2
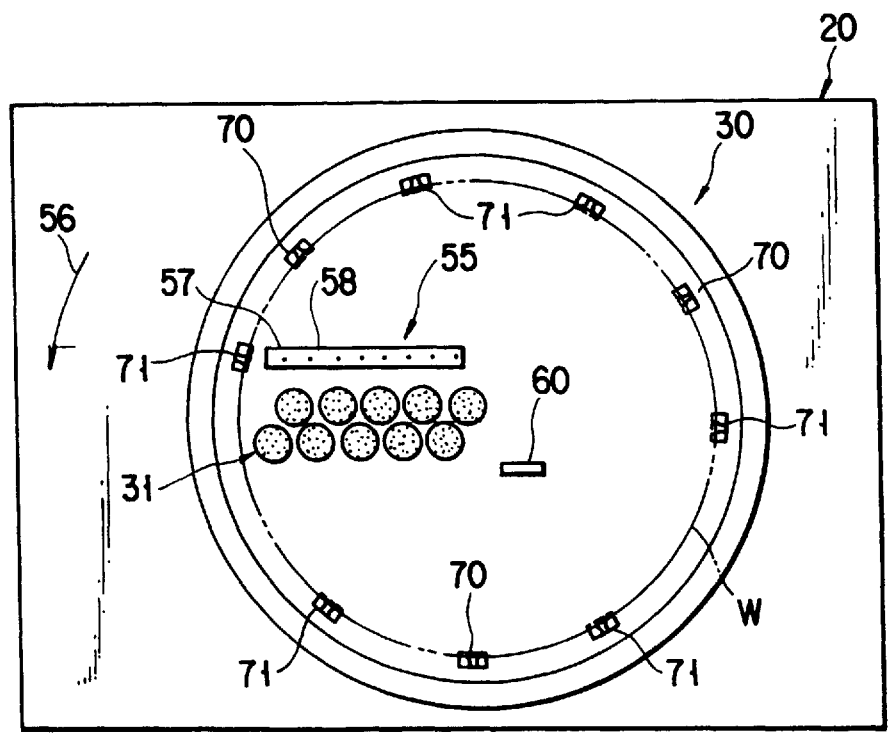
F I G. 3

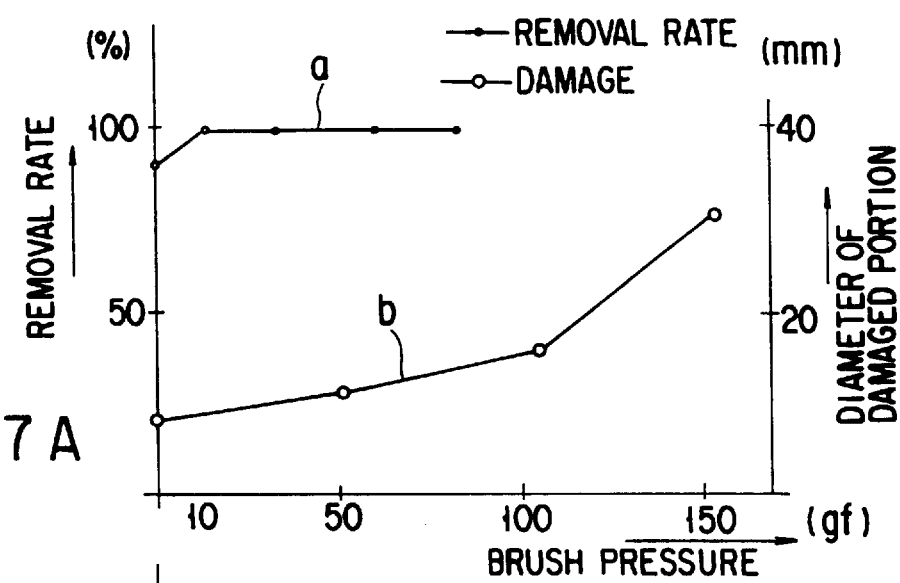
F I G. 7A
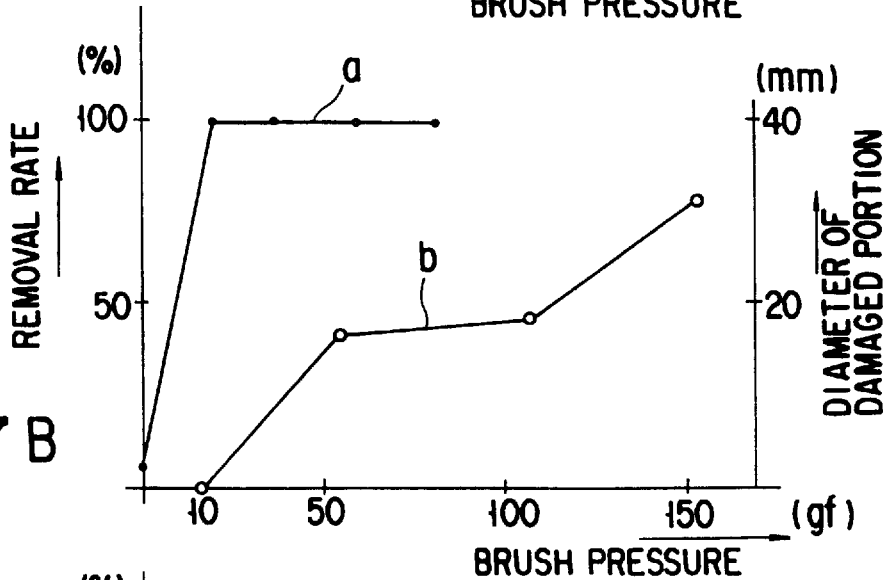
F I G. 7B
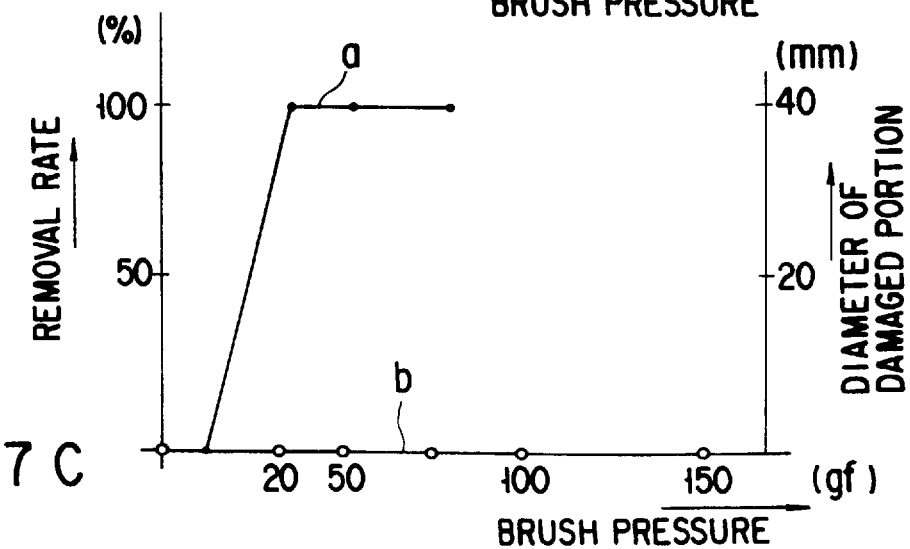
F I G. 7C

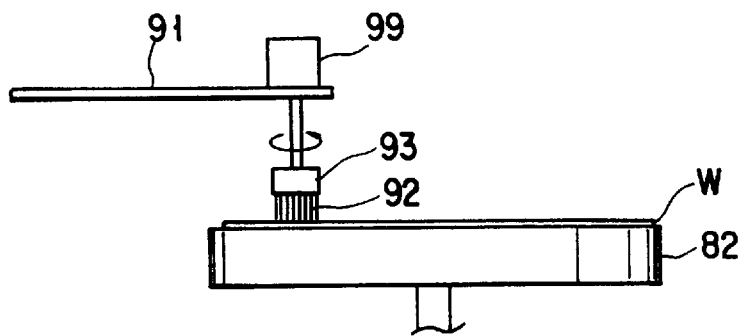
F I G. 14
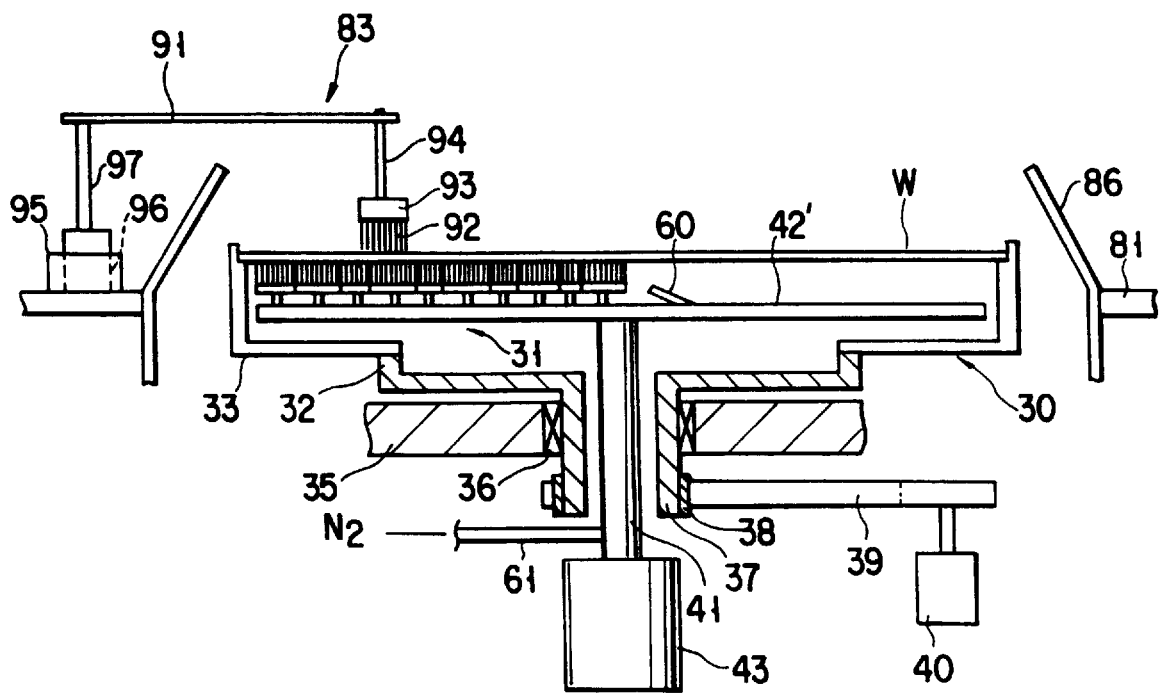
F I G. 15

METHOD FOR CLEANING SUBSTRATES

This is a division of application Ser. No. 08/587,485 filed on Jan. 17, 1996 now U.S. Pat. No. 5,651,160.

BACKGROUND OF THE INVENTION

1. Field of the Invention

The present invention relates to a cleaning apparatus and a cleaning method for cleaning a substrate, such as a semiconductor wafer.

2. Description of the Related Art

Generally, in the process of manufacturing a semiconductor device, for example, a circuit, an electrode pattern and the like, are formed on a substrate to be processed, such as a semiconductor wafer. In this formation, a series of steps in which a circuit pattern and the like are transferred on a photoresist in a reduced size by a photolithography technique, and the transferred image is developed, are carried out.

In the above-mentioned series of steps, a resist solution is applied on a semiconductor wafer, and then an exposure step and a development step are carried out. However, before the series of preset steps are carried out, it is necessary that the surface of a semiconductor wafer, on which a resist solution is applied for the purpose of avoiding the occurrence of defects in a circuit pattern or the shortcircuit of wiring, should be cleaned and even the rear surface of the semiconductor wafer should be cleaned so as to prevent a focus error during an exposure or the generation of particles.

Such a cleaning apparatus for cleaning a semiconductor wafer is disclosed in, for example, Jpn. Pat. Appln. KOKAI Publication No. 2-271622. According to the technique discussed in this document, a semiconductor wafer is vibrated so as to remove foreign matters stuck on the semiconductor wafer, and a brush which is rotated at a predetermined rotation speed, is brought into contact with the semiconductor wafer also to remove the foreign matters.

However, in the above-described removing device, the brush which is brought into contact with a semiconductor wafer over the radius of the rotation of the semiconductor wafer, is always rotated at a predetermined rotation speed. With this structure, the rotation moving distance of the semiconductor wafer differs from one point to another over between the center portion of the wafer and the peripheral portion thereof. Therefore, the cleaned surface of the semiconductor wafer is damaged by the rotating brush. Further, due to the difference in the rotation moving distance, the cleaned surface of the semiconductor wafer is irregularly damaged (the degree of damage differs from one location to another on the surface of the wafer, creating an irregular damage).

Moreover, a cleaning solution is supplied from a nozzle, near the brush brought into contact with the wafer. However, the cleaning solution is not supplied to the entire portion of the brush, and a part of the brush is brought into contact with a dry section of the semiconductor wafer, thus further damaging the wafer. Further, since the equal amount of the cleaning solution cannot be supplied to the entire portion of the brush, an irregular treatment of the cleaning occurs in some cases.

SUMMARY OF THE INVENTION

An object of the present invention is to provide a cleaning apparatus and a cleaning method capable of removing foreign matters stuck on a substrate to be processed, while the substrate is cleaned, and suppressing the damage on the substrate during the cleaning.

According an aspect of the present invention, there is provided a cleaning apparatus for cleaning a substrate, comprising: holding means for holding the substrate; rotating means for rotating the substrate, held by the holding means; and a cleaning section provided on at least one side of the substrate held by the holding means; wherein the cleaning section has at least one cleaning member provided so that the cleaning member can be brought into contact with the substrate, and the cleaning member is rotated along with the substrate, rotated by the rotating means while the cleaning member is in contact with the substrate.

According to another aspect of the present invention, there is provided a cleaning apparatus for cleaning a substrate, comprising: holding means for holding the substrate; rotating means for rotating the substrate, held by the holding means; and a cleaning section provided on at least one side of the substrate held by the holding means, and having at least one cleaning member provided so that the cleaning member can be brought into contact with the substrate, and rotated along with the substrate, rotated by the rotating means while the cleaning member is in contact with the substrate; cleaning solution supplying means for supplying a cleaning solution to the substrate; and gas supply means for supplying a gas to the substrate.

According to still another aspect of the present invention, there is provided a cleaning apparatus for cleaning a substrate, comprising: holding means for holding the substrate; rotating means for rotating the substrate, held by the holding means; and a cleaning portion provided on at least one side of the substrate held by the holding means; wherein the cleaning section has at least one cleaning member provided so that the cleaning member can be brought into contact with the substrate, driving means for rotating the cleaning member, and controlling means for controlling the cleaning member in one of a rotation state, a free state and a substantially fixed state.

According to another aspect of the present invention, there is provided a cleaning apparatus for cleaning a substrate, comprising: holding means for holding a fringe portion of the substrate; rotating means for rotating the substrate, held by the holding means; a cleaning section having at least one cleaning member provided so that the cleaning member can be brought into contact with the substrate, driving means for rotating the cleaning member, and controlling means for controlling the cleaning member in one of a rotation state, a free state and a substantially fixed state; cleaning solution supplying means for supplying a cleaning solution to a rear side of the cleaning member in terms of a rotation direction of the substrate; and gas spray means for spraying a gas to a front side of the cleaning member in terms of the rotation direction of the substrate.

According to still another aspect of the present invention, there is provided a cleaning method for cleaning a substrate, comprising the steps of: holding the substrate; rotating the substrate to be processed, held by the holding means; and cleaning the substrate by bringing a cleaning member into contact with at least one side of the substrate held by the holding means, and rotating the substrate, along with a rotation of the substrate.

According to still another aspect of the present invention, there is provided a cleaning method for cleaning a substrate, comprising the steps of: holding the substrate; supplying a cleaning solution to at least one side of the substrate to be processed; rotating the substrate, held by the holding means;

cleaning the substrate by bringing a cleaning member into contact with at least one side of the substrate held by the holding means, and rotating the substrate, along with a rotation of the substrate; and supplying a drying gas to at least one side of the substrate.

According to the present invention, the cleaning section is provided on at least one side of the substrate. The cleaning section has at least one cleaning member provided so that the cleaning member can be brought into contact with the substrate, and the cooling member is rotated along with the substrate, rotated by the rotating means while the cleaning member is in contact with the substrate. In other words, the cleaning member rotates so as to follow up the substrate in accordance with the difference in rotation movement in terms of the diameter direction of the rotating substrate. Therefore, the damage caused when the substrate is brought into contact with the contact portion, can be suppressed.

Further, according to another embodiment of the present invention, the cleaning member can be controlled in either one of the rotation state, the free state and the fixed state in which the cleaning member is not substantially rotated. Thus, a desired cleaning mode can be selected in accordance with the type of a substrate, a location of a substrate, or the type of a film formed on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view showing an entire structure of a coating-development apparatus including a cleaning apparatus according to an embodiment of the present invention;

FIG. 2 is a brief cross sectional view of the cleaning apparatus according to the embodiment of the present invention, used in the coating-development apparatus shown in FIG. 1;

FIG. 3 is a brief plan view of the cleaning apparatus according to the embodiment of the present invention, used in the coating-development apparatus shown in FIG. 1;

FIGS. 7A to 7C each are a graph illustrating a damage to a substrate to be processed, caused in a cleaning step;

FIG. 14 is a diagram illustrating a different version of the cleaning portion of the cleaning apparatus shown in FIG. 14; and FIG. 15 is a cross sectional view of a cleaning apparatus equipped with both the cleaning section shown in FIG. 2 and the cleaning section shown in FIG. 12.

DETAILED DESCRIPTION OF THE PREFERRED EMBODIMENTS

Figure 4:
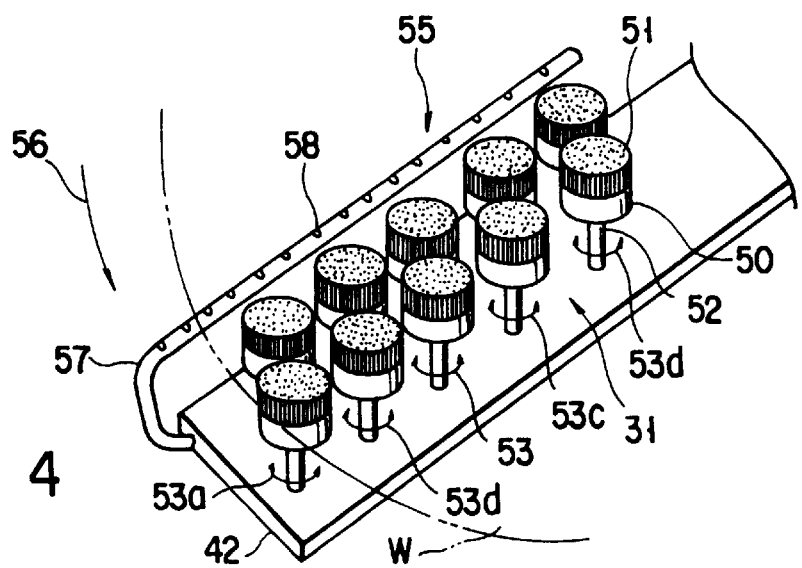
FIG. 4 is a perspective view of the main portion of the cleaning section used in the cleaning apparatus according to the embodiment of the present invention.

The present invention will now be described in connection with exemplified embodiments in which the invention is applied to a cleaning apparatus used in a resist coating-development apparatus.

Before the cleaning apparatus of the present invention will be described, the entire structure of a coating-development apparatus will now be first explained briefly with reference to FIG. 1. The coating-development apparatus includes a carrier stage 1 on which a carrier 11 for containing and carrying a plurality of semiconductor wafers, can be placed; a coating-development unit 2 for subjecting a semiconductor wafer W to a coating-development process; and a carrying mechanism 3 provided between a carrier stage 1 and a processing unit 2, for carrying a semiconductor wafer W between the carrier 11 on the stage 1 and the processing unit 2. On the carrier stage 10, the carrier is loaded onto the apparatus, or unloaded therefrom. Further, the carrying mechanism 3 has a carrying arm 12, by which a semiconductor wafer W is carried between the carrier 11 and the processing unit 2.

The coating-development unit 2 consists of a first unit 2a in the front stage and a second unit 2b in the rear stage. The first unit 2a and the second unit 2b respectively have paths P1 and P2 at the center portions thereof. On both sides of the paths P1 and P2, the processing sections are arranged. Further, a relay section 15 is provided between the first and second units 2a and 2b.

The first unit 2a includes a main arm 13 which is movable along the path P1. Further, the unit 2a has, on one side of the path P1, a cleaning apparatus 20 for cleaning the rear surface of a semiconductor wafer, a water cleaning apparatus 21 for cleaning the surface of a semiconductor wafer, an adhesion section 22, and a cooling section 23, and on the other side, two coating devices 25. The main arm 13 has functions of passing a semiconductor wafer W between the arm 12 of the carrying mechanism 3 and the arm 13 itself, loading a wafer W to each of the sections in the first unit 2a and unloading it therefrom, and also passing a semiconductor wafer between the relay section 15 and the arm itself.

The second unit 2b has a main arm 14 which is movable along the path P2. The unit 2b also includes a plurality of heating sections 26 on one side of the path P2, and two developing section 27 on the other side of the path. At the rear end portion of the second unit 2b, an interface 28 to which an exposure device 29 can be mounted, is provided. The main arm 13 has functions of passing a semiconductor wafer W between the relay section and the arm 13 itself, and loading a wafer W to each of the sections in the second unit 2b and unloading it therefrom.

In the coating-developing apparatus having the above-described structure, a semiconductor wafer W in the carrier 11 is passed to the main arm 13 of the first unit by the arm 12 of the carrying mechanism 3, and then to the rear surface cleaning device 20 by the main arm 13. By the cleaning device 20, the rear surface of the wafer W is cleaned.

Further, the semiconductor wafer W is carried by the main arm 13 in a similar manner to the surface cleaning device 21, where the surface of the semiconductor wafer W, on which a circuit is formed, is cleaned. Then, in the adhesion section 22, the wafer W is subjected to a process in which the wafer is made hydrophobic, and the wafer is cooled in the cooling section 23. After that, a photoresist film, that is, a photosensitive film, is formed on the wafer W in the coating section 25.

Subsequently, the photoresist film is heated and subjected to the prebaking in the heating section 26, and then exposed into a predetermined pattern by an exposure device 29 situated at the rear end portion of the second unit 2b. After the exposure, the glass substrate is loaded into the development unit 27, where the photoresist film is developed by a developing solution. Then, the substrate is sent back into, for example, the original carrier 11 by the main arms 13 and 14, and the arm 12 of the carrying mechanism 3.

Next, the rear surface cleaning device 20 according to an embodiment of the present invention will now be described. As can be seen in the cross sectional view and the plan view of FIGS. 2 and 3, the cleaning device 20 has a holding mechanism 30 for holding a fringe portion of a semiconductor wafer W, and a cleaning section 31 provided underneath the semiconductor wafer W held by the holding mechanism 30.

The holding mechanism 30 includes a rotation chuck 32, three holding members 33 having holding portions 70 which extend radially from the rotation chuck 32 to a position corresponding to the fringe portion of the semiconductor wafer W, for holding the wafer as the holding portions engage with the fringe portion thereof, and six supporting members having supporting portions 71, having the above-described structure, for supporting the fringe portion of the semiconductor wafer W. The three holding portions 70 and the six supporting portions 71 are provided so that each holding portion 70 is interposed between two supporting portions 71.

The holding mechanism 30 has a cylindrical portion 37 having a small diameter, which extends downward from the bottom portion of the rotation chuck 32 and is supported by a fixing portion 35 and a bearing portion 36. A belt 39 is rolled on a pulley 38 provided on an outer side of the cylinder portion 37, and thus the holding mechanism can rotate around the vertical axis by means of the belt 39. The belt 39 is stretched around the driving shaft of a motor 40 serving as driving means, and rotation means for rotating the holding mechanism 30 is constituted by the motor 40 and the belt 39.

The cleaning section 31 is provided on a lifting stage 42, which is situated on a lifting shaft 41 piercing through the cylindrical portion 37, along the central axis of a semiconductor wafer W, and connected to an air cylinder 43 which is, for example, lifting means.

As can be seen in FIG. 4, the cleaning section 31 has a cleaning members which is brought into contact with a semiconductor wafer W, that is, for example, cleaning brushes 51 transplanted vertically on brush bases 50, and shaft portions 52 connected to the brush bases 50, respectively and provided rotatably onto the lifting stage 42. With this structure, each cleaning brush 51 is formed so as to be freely rotatable as indicated by an arrow 53 in the figure, in accordance with the direction of the rotation of the semiconductor wafer W.

A plurality of cleaning brushes 51 are provided from the center portion of the semiconductor wafer W to the fringe portion thereof, and are arranged in a staggered manner on the lifting stage 42 so as to avoid the irregular cleaning of the semiconductor wafer W. The bristle of the cleaning brush 51 is made of a resin such as of polyvinyl carbon (PVC), and each piece has a diameter of, for example, about 0.2 mm. In order to perform a uniform cleaning, the plurality of cleaning brushes 51 of different sizes can be used. More specifically, it may be arranged so that brushes of larger diameters are situated on the outer side and those of smaller diameters are situated on the inner side. Or the plurality of cleaning brushes 51 of different hardenesses can be used. More specifically, it may be arranged so that softer brushes are situated on the inner side and harder brushes are situated on the outer side. Further, a plurality of types of bristle pieces having different hardnesses can be used in one brush 51.

On the rear side of the cleaning section 31, in terms of the rotation direction 56 of a semiconductor wafer W, a cleaning solution supplying mechanism 55 for supplying a cleaning solution uniformly to the entire region of the cleaning brush 51, is provided. The cleaning solution supplying mechanism 55 has a supplying tube 57 for supplying liquids of cleaning solutions such as pure water, solvents and the like, and a plurality of supplying openings 58 formed in the supplying tube 57, for supplying the cleaning solution to the lower surface of the semiconductor wafer W.

As can be seen in FIGS. 2 and 3, above the lifting stage 42, there is provided a gas supplying nozzle 60 for supplying a drying gas, for example, $N_2$ gas or heated clean air, to the opposite side to the cleaning solution supplying mechanism 55 of the cleaning section 31, that is, the front side of the rotation direction 56 of the semiconductor wafer W.

The gas supplying nozzle 60 should preferably be provided so that it can blow a gas from the most inner side portion of the cleaning brush 51 brought into contact with the semiconductor wafer W towards the fringe portion of the wafer W. With this structure, cleaning solution stuck on the rear surface of the wafer W can be scattered out of the wafer W, making it possible to dry the semiconductor wafer W efficiently.

Further, the nozzle 60 is connected to an external gas supplying tube 61 via a gas flow path running in the lifting shaft 41.

Figure 5A:
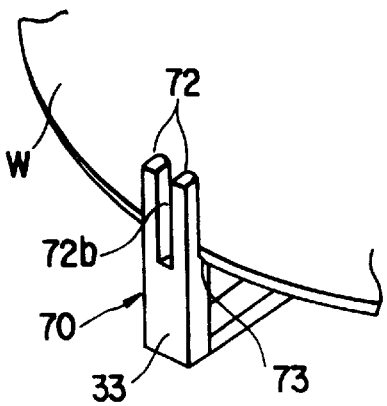
FIG. 5A is a perspective view showing a holding portion of a holding member of the cleaning apparatus shown in FIG. 2.
Figure 5B:
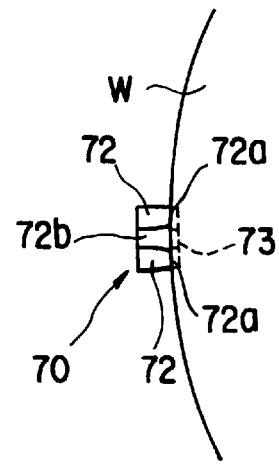
FIG. 5B is a plan view showing the holding portion of the holding member of the cleaning apparatus shown in FIG. 2.
Figure 5C:
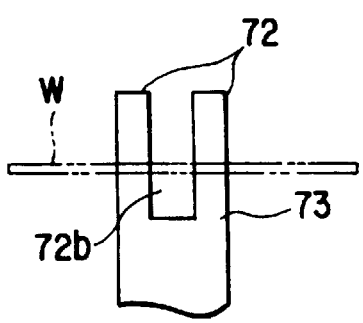
FIG. 5C is a front view showing the holding portion of the holding member of the cleaning apparatus shown in FIG. 2.

As can be seen in FIGS. 5A, 5B and 5C, each holding portion 70 of the holding mechanism 30 has two contact members 72 brought into contact with the fringe portion of a semiconductor wafer W and a stepped portion 73 for supporting the fringe portion of the lower surface of the semiconductor wafer W. Portions 72a of each contact member 72, which are brought into contact with the fringe portion of the semiconductor wafer W, should be in contact with the fringe portion of the wafer by points as small as possible, so as to avoid cleaning solution remaining between the portions 72 and the fringe portion of the semiconductor wafer W. Further, between the two contact members 72, a gap section 72b is formed, and the efficiency of removing the cleaning solution can be improved in the presence of the gap portion 72b. The gap portion 72b extends lower than the level of the semiconductor wafer W as can be seen in FIG. 5C, and therefore cleaning solution can be discarded from both the upper and lower sides of the semiconductor wafer W, thus further improving the efficiency of the removal of the solution. The holding portion can be moved forward and backward, and has a function of holding and aligning the semiconductor wafer W. It should be noted that three or more contact members 72 can be provided to make three or more contact points.

The supporting portion 71 has basically a structure similar to that of the holding portion 70, except for the following. That is, the holding portion 70 has a function of holding and aligning a wafer W, whereas the supporting portion 71 is fixedly provided so as to only support the wafer W.

In order to surely hold a semiconductor wafer W, at least three holding members 70 are required, whereas in order to prevent the displacement of a semiconductor wafer W carried therein and to output the wafer horizontally, at least three, for example, six supporting members 71, should be provided as shown in the figure.

Next, the operation of the cleaning apparatus 20 having the above-described structure, will be described.

First, a semiconductor wafer W is passed from the main arm 13 shown in FIG. 1 onto the three holding members 70 and the six supporting members 71 of the holding mechanism 30 of the cleaning apparatus 20, shown in FIG. 2. Then, the three holding members 70 are moved forward so as to hold the semiconductor wafer W.

After the passing of the wafer, the motor 40 is driven so as to rotate the holding mechanism 30, thus rotating the semiconductor wafer W. Then, in accordance with necessity, water is jet-sprayed from a jet water nozzle (not shown) to the semiconductor wafer W so as to jet-wash the wafer with water. Subsequently, while spraying cleaning solution (for example, pure water) from the supplying openings 58 of the cleaning solution supplying mechanism 55 to the rear surface of the wafer W, the air cylinder 43 is driven so as to lift the lifting stage 42, thus bringing the cleaning brush 51 of the cleaning portion 31 into contact with the rear surface of the wafer W at a predetermined pressure.

A plurality of cleaning brushes 51 serving as a cleaning member are provided to be rotatable in a free state with regard to the lifting stage 42, and therefore when the cleaning brushes 51 are brought into contact with the rear surface of a semiconductor in a rotating state, these cleaning brushes are rotated independently from each other, as following up the rotation of the wafer W. Thus, the brushes 51 rotates only to follow up the rotation of the semiconductor wafer W, damages caused by the cleaning member as it is brought into contact with the wafer W can be suppressed. With regard to this rotation, the moving distance by the rotation is longer in the fringe portion of the wafer W due to the difference in circumferential speed between the center portion and the fringe portion; therefore the rotation speed is higher for cleaning brushes situated in the center portion of the wafer W than for those situated at the fringe portion thereof. More specifically, the rotation speed $t_1$ of the brush situated at the outermost position shown in FIG. 3 is highest, and as the position becomes close to the center, the rotation speed decreases as $t_2$, $t_3$ and $t_4$ downwards. In other words, the correlation of the rotation speeds is as follows: $t_1 > t_2 > t_3 > t_4$.

In the meantime, $N_2$ gas is supplied from the nozzle 60 to blow from the center portion of the semiconductor wafer W to the periphery portion, and cleaning solution stuck on the rear surface of the wafer W is scattered out of the wafer W. Thus, the rear surface of the semiconductor wafer W is cleaned.

Figure 6:
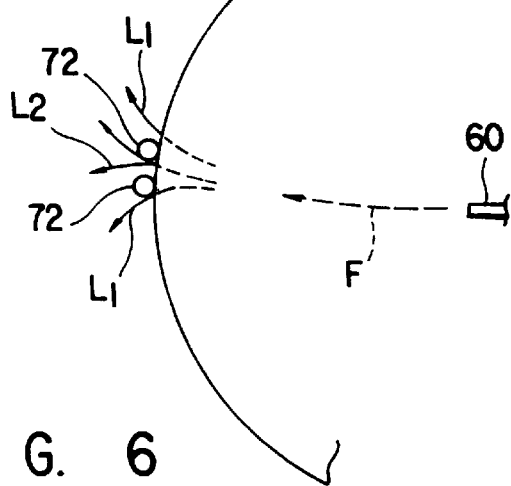
FIG. 6 is a plan view illustrating a cleaning operation of the cleaning section of the cleaning apparatus according to the embodiment of the present invention.

In this cleaning step, as shown in FIG. 6, the flow F of a portion of the cleaning solution is directed from the center portion of the semiconductor wafer W towards the fringe portion thereof, by the $N_2$ gas blown from the nozzle 60 or the centrifugal force of the rotating semiconductor wafer, and then scattered out of the wafer W. Another portion of the cleaning solution, which is directed towards the contact members 72 serving to hold the semiconductor wafer W, is divided into a liquid L1 flowing outside the contact members 72 and a liquid L2 flowing between a contact member 72 and another contact member 72, and then scattered out of the semiconductor wafer W. Consequently, a contact portions 72a by which a contact member 72 is brought into contact with a semiconductor wafer W, should be made to achieve as close as possible to point contact, so as to have a high efficiency in the removal of liquid.

Then, after a predetermined time period, that is, a time elapse until the completion of the cleaning of the wafer W, the air cylinder 43 is driven so as to move down the lifting stage 42, thus separating the rear surface of the semiconductor wafer W and the cleaning brushes 51 from each other. Thereafter, the cleaning solution supplied from the supplying openings 58 of the cleaning solution supplying mechanism 55 is stopped, and the $N_2$ gas blown from the nozzle 60 is stopped.

After that, the semiconductor wafer W held by the holding means 30 is rotated for a predetermined time, so as to dry the semiconductor wafer W.

Figure 13:
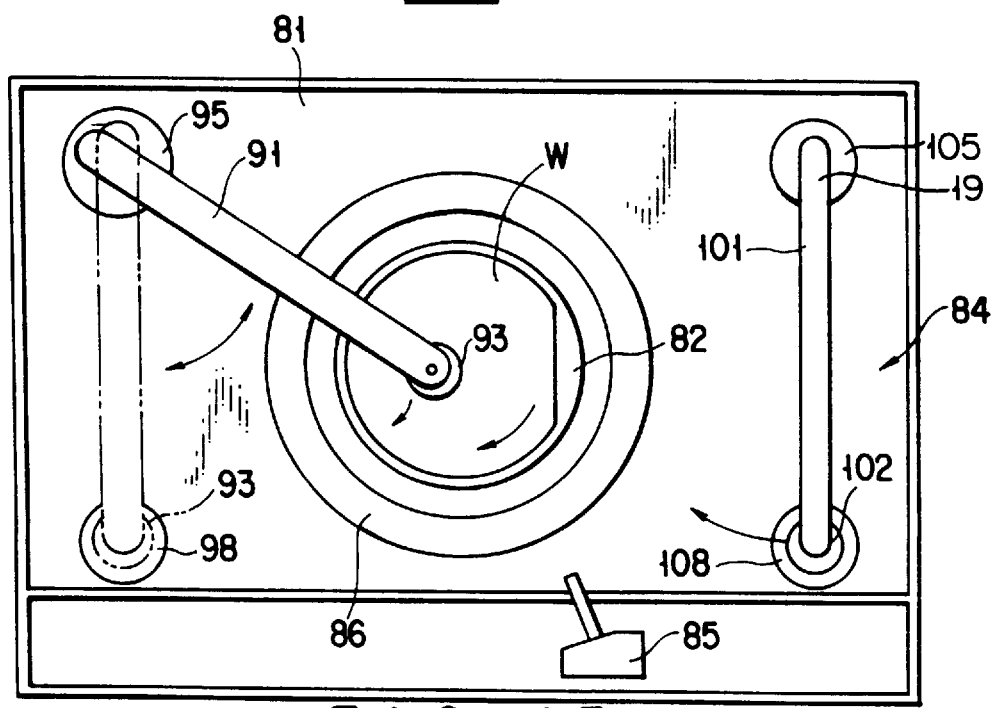
FIG. 13 is a brief plan view of the cleaning apparatus shown in FIG. 12.

After the drying, the semiconductor wafer W is removed from the holding portion 70 of the holding member 33, and unloaded from the cleaning apparatus 20 by the main arm 13 shown in FIG. 13. Then, the wafer is loaded to other devices 21, 22, 23, 26 and 27 shown in FIG. 1 in accordance with a preset program, and subjected to the respective processes in these devices.

Next, the effect of the cleaning by use of the cleaning device, will now be described.

In the cleaning step by use of the cleaning apparatus 20, as described above, a plurality of cleaning brushes 51 are rotated independently from each other as they are brought into contact with the rear surface of the rotating semiconductor wafer W. FIG. 7 shows the results of the comparison between the case where the wafer was cleaned as described above, the case where the cleaning brushes 51 were not rotated, and the case where the plurality of cleaning brushes 51 were not rotated along the rotation of the wafer W but by rotation means such as a motor.

FIG. 7A is a graph of the case where a semiconductor wafer W was cleaned by rotating the cleaning brushes 51 at 50 rpm using a motor, with regard to the semiconductor wafer W on which a resist film was formed, and then a P.S.L. was applied thereon. It should be noted that the curve a in the figure indicates the removing rate of the P.S.L., and the curve b indicates the diameter of a portion damaged in the resist film cleaning step. The damage caused by the resist film cleaning step under this condition, is increased in accordance with an increase in the brushing pressure of the cleaning brushes 51 against the semiconductor wafer W, and it can be observed that the diameter of the damaged portion of the resist film was about 10 mm even if no brushing pressure was applied.

Next, FIG. 7B is a graph of the case where a semiconductor wafer W of the same type as shown in FIG. 7A was cleaned as the wafer W is rotated while the cleaning brushes 51, which were, in this case, fixed (not rotated), were brought into contact with the wafer W. The damage caused by the resist film cleaning step under this condition, was increased in accordance with an increase in the brushing pressure of the cleaning brushes 51 against the semiconductor wafer W when the brushing pressure was 10 gf or more, and it can be observed that the removing rate of the P.S.L. became 100% when the brushing pressure got close to 10 gf, as in the case shown in FIG. 7A. However, in order to make the removing rate of the P.S.L. 98% or more, close to 100%, and also avoid the damage, the brushing pressure of the brush must be close 10 gf, and thus the margin of the brushing pressure is narrow.

FIG. 7C is a graph of the case where a semiconductor wafer W was cleaned in such a manner that, as a plurality of the cleaning brushes 51 according to this embodiment are brought into contact with the semiconductor wafer W, the brushes 51 are rotated independently from each other along with the rotation of the semiconductor wafer W. In the resist film cleaning step under this condition, no damage is caused even when the brushing pressure of the cleaning brushes 51 with respect to the semiconductor wafer W was as high as 150 gf. It can be observed that the removing rate of the P.S.L. became 100% when the brushing pressure got close to 20 gf.

As described above, in this embodiment, a wafer W is cleaned in such a manner that, as a plurality of cleaning brushes 51 are brought into contact with the rear surface of a semiconductor wafer W, these cleaning brushes 51 are rotated independently from each other along with the rotation of the wafer W. With this structure, damage to an underlying layer, for example, a resist film, of a semiconductor wafer W, or damage to a semiconductor wafer W itself, can be suppressed. Thus, the occurrence of the damage can be suppressed and therefore the yield of the cleaning process for the semiconductor wafer W can be improved.

The brushing pressure can be set from about 20 gf within a range in which the semiconductor wafer W is not removed from the holding mechanism 30, and thus the margin of the brushing pressure can be broadened. Consequently, the brushing pressure can be easily set, improving the efficiency of work such as maintenance.

Each holding portion 70 for holding the fringe portion of a semiconductor wafer W is brought into contact with the wafer W by at least two contact portions 72a, and the contact portions 72a are in contact with the fringe portion of the wafer W by point contact. Consequently, the remaining of the cleaning solution between the contact portions 72a and the semiconductor wafer W can be suppressed, and the throughput of the wafer drying step can be improved.

Further, the cleaning solution is supplied from the supplying openings 58 of the cleaning solution supplying mechanism 55 to substantially the entire portion of the cleaning brushes 51, in the rear side of the cleaning brushes 51 in terms of the rotation of the wafer W. Therefore, the cleaning brushes 51 can be prevented from being brought into contact with a dry region of the semiconductor wafer W. Thus, the damage caused by the cleaning brushes 51 on the semiconductor wafer W can be reduced, and the cleaning efficiency can be improved.

Furthermore, the drying gas is blown from the nozzle 60 to the rear side of the cleaning brushes 51 in terms of the rotation direction of the semiconductor wafer W, and therefore the portion of the cleaning solution stuck on the semiconductor wafer during the cleaning or remaining thereafter can be blown out of the wafer by, for example, the $N_2$ gas. Thus, the wafer can be mostly dried at this point, and the time used for the scattering off drying can be shortened, thus improving the throughput.

Figure 8:
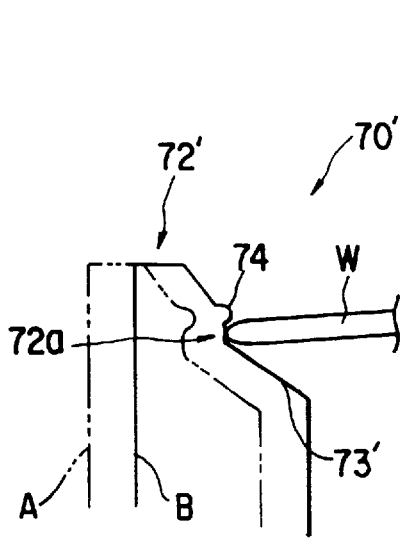
FIG. 8 is a diagram showing another example of the holding portion shown in FIGS. 5A to 5C.

Next, another example of the holding member for a semiconductor wafer W is described with reference to FIG. 8. A holding portion 70' shown in this figure has two contact members 72' brought into contact with the fringe portion of the semiconductor wafer W and a stepped portion 73' for supporting the fringe portion of the lower surface of the wafer W. The holding portion 70' is similar in structure to the holding portion 70 in the above-described respect; however they are different from each other in the following respect. That is, a projecting stopper portion 74 is provided for each contact member 72' for holding down the upper surface side of the semiconductor wafer W. When the holding portion 70' is moved towards the center from a position A indicated by a two-dot chain line to a position B indicated by a solid line in the figure, the contact members 72' are brought into contact with the fringe portion of the semiconductor wafer W, and the wafer W is held between the wafer stopper portion 74 and the stepped portion 73'. With this structure, even if the brushing pressure of the cleaning brushes 51 brought into contact with the rear surface of the wafer W is increased, the cleaning process can be performed safely without having the wafer W removed from the contact members 72'.

Figure 9:
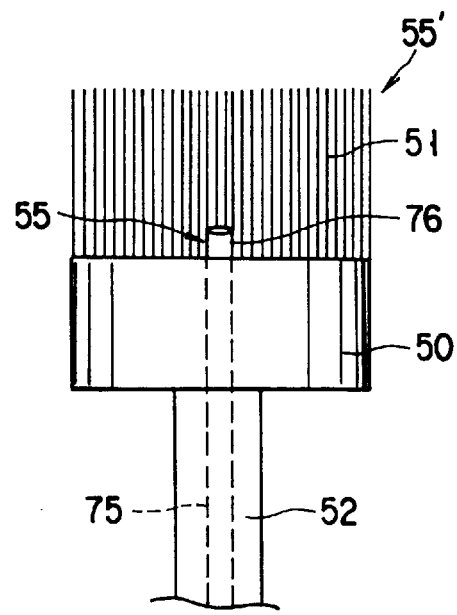
FIG. 9 is a cross sectional view showing another example of the cleaning brush used in the cleaning portion.

Next, another example of the cleaning brushes and the cleaning solution supplying mechanism will now be described with reference to FIG. 9.

A cleaning solution supplying means 55' has a supplying tube 75 formed within a shaft portion 52 and a brushing base 50 of the cleaning member, for supplying liquids of cleaning solutions such as pure water and solvent, and a supplying opening 76 projecting from the brushing base, for supplying the cleaning solution from the gaps between the cleaning brushes 51 towards the semiconductor wafer W. With this structure, the cleaning solution can be surely supplied to the cleaning brushes 51, thus improving the reliability of the process. Further, the cleaning brushes 51 and the cleaning solution supplying means 55 are integrated, the space occupied by the device can be reduced.

Next, another example of the cleaning portion will now be described with reference to FIG. 10. In a cleaning section 31' of this example, one cleaning brush 51 is provided instead of a plurality of cleaning brushes 51, and a cleaning unit 62 movable in the radial direction of the semiconductor wafer W held by the holding mechanism 30.

The cleaning unit 62 has, other than the cleaning brush 51, a cleaning solution nozzle 63, and a gas supplying nozzle 64 for supplying a drying gas, for example, $N_2$ gas or heated clean air, all of which are moved as an integral body. The gas jetted out from the gas supplying nozzle 64 is supplied from a gas supplying tube 61a via a gas flow path running within the lifting shaft 41. As supplying gas into the lifting stage 42, the cleaning unit 62 is moved by the pressure of the gas. The gas used for moving the cleaning unit is supplied from a gas supplying tube 61b via a gas flow path running through the lifting shaft 41.

In the example shown in this figure, a jet water nozzle 65 is provided at the center portion of the lifting stage 42. The angle of the jet water nozzle 65 can be adjusted so that jet water can be supplied to any position from the center portion to the fringe of the wafer W.

In the case where a semiconductor wafer W is cleaned by the cleaning section 31' having the above structure, the semiconductor wafer W is passed onto the holding mechanism 30, and then the motor 40 is driven to rotate the holding mechanism 30. Thus, the semiconductor wafer W is rotated, and jet water is applied from the jet water nozzle 65 to the wafer W, thus performing a jet water cleaning, in accordance with necessity. After that, while spraying the cleaning solution (for example, pure water) onto the rear surface of the semiconductor wafer W from the cleaning solution nozzle 63 of the cleaning unit 62, the air cylinder 43 is driven to lift up the lifting stage 42. Thus, the cleaning brush 51 provided in the cleaning unit 62 of the cleaning section 31' is brought into contact with the center portion of the rear surface of the wafer W at a predetermined pressure. While performing the cleaning with the brush 51, the cleaning unit 62 is moved towards the fringe portion of the wafer W by means of the gas supplied from the gas supplying tube 61a. Further, the gas supplying nozzle 64 blows out the $N_2$ gas from the center portion of the wafer W towards the fringe portion, and thus cleaning solution stuck on the rear surface of the wafer W is scattered out of the wafer W, promoting the drying.

As described above, the entire rear surface of the semiconductor wafer W is cleaned. In this cleaning process, the wafer is cleaned while moving the cleaning brush 51, and therefore it is not necessary to prepare a plurality of cleaning brushes. Further, since the cleaning solution nozzle is provided for the cleaning unit 62, the cleaning solution can supplied surely to a portion of a semiconductor wafer, which is to be cleaned.

Figure 11:
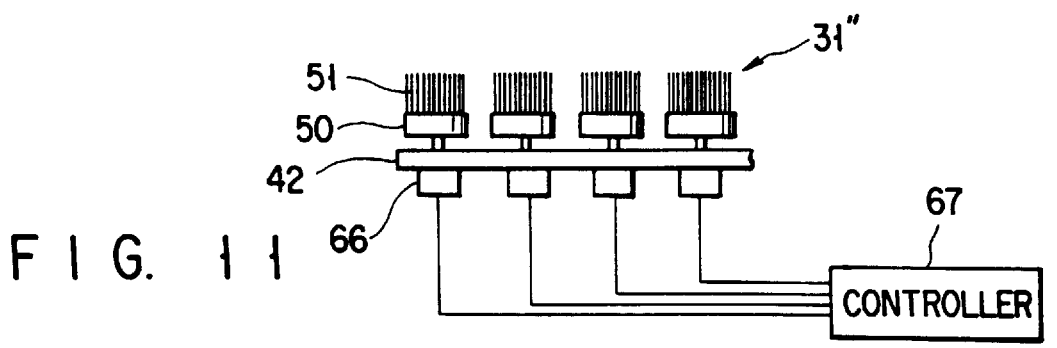
FIG. 11 is a brief side view showing a main portion of another example of the cleaning portion.

Still another example of the cleaning portion will now be described with reference to FIG. 11. A cleaning section 31" of this example includes a plurality of cleaning brushes 51 as in the cleaning section 31 shown in FIGS. 2 and 3, and each of the cleaning brushes 51 is connected to an excitable motor 66 such as a stepping motor, and can be rotated by the respective motor 66. The motors 66 are able to switch the state of the brushes 51, between the rotation state, the free state and the fixation state in which the brushes are not substantially rotated (in the substantially fixed state). The excitable motors 66 are controlled by the controller 67 so as to select either one of these states. With the cleaning section 31" having the above-described structure, each of the plurality of cleaning brushes 51 can be independently set to the rotation state, the free state and the substantially not rotated state (in the substantially fixed state). Therefore, a predetermined cleaning mode can be selected in accordance with the type of a semiconductor wafer W, the location on this wafer, or the type of a film formed on the wafer W.

Only one excitable motor may be provided instead of a plurality of excitable motors. In this case, the brushes 51 can be rotated with a belt mechanism.

Figure 10:
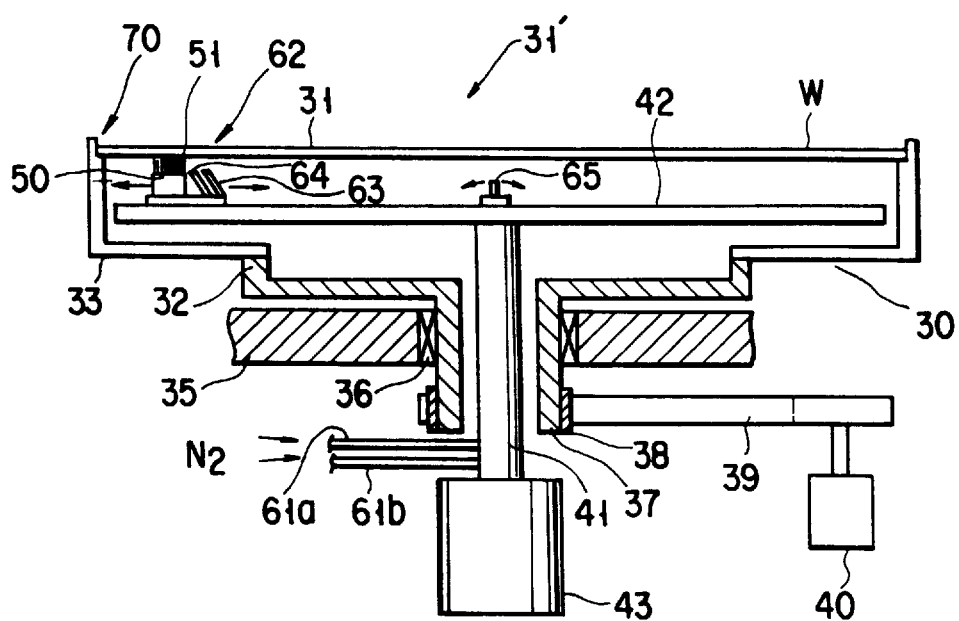
FIG. 10 is a brief sectional view of a cleaning apparatus according to another embodiment of the present invention.

Such an excitable motor such as a stepping motor can be applied to the cleaning unit 62 shown in FIG. 10, and a cleaning mode of the cleaning brush 51 can be selected from the rotating state, the free state and the state in which the mode is not substantially rotated.

Figure 12:
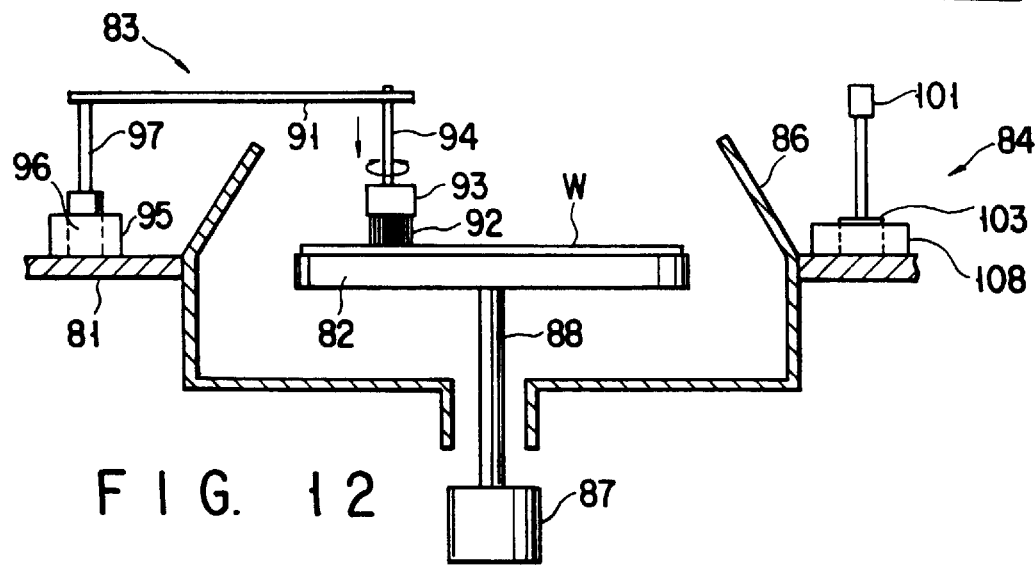
FIG. 12 is a brief cross sectional view of a cleaning apparatus according to still another embodiment of the present invention.

Next, an embodiment in which the present invention is applied to a surface cleaning device 21 for cleaning the surface of a semiconductor wafer, on which a circuit is formed, will now be described with reference to FIGS. 12 and 13.

The surface cleaning device 21 comprises a device main body 81, a spin chuck 82 for attracting and rotatably holding a semiconductor wafer W, cleaning section 83 for cleaning the surface of the semiconductor wafer W on which a circuit is formed, an ultrasonic water supplying mechanism 84 for supplying ultrasonic vibration water, and a cleaning nozzle 85 for supplying a cleaning solution (for example, pure water) on the surface of a semiconductor wafer W. Further, a cup 86 is provided to surround the spin chuck 82, for preventing the cleaning solution or the like from scattering around.

A semiconductor wafer W is attracted and held on the spin chuck 82, with the surface of the wafer W, on which a circuit is formed, facing upward. The spin chuck 82 is rotated by a motor 87 via a rotation shaft 88.

The cleaning section 83 is provided on a side of the spin chuck 82 in the base of the main body 81, and has an arm 91, a cleaning brush 92 serving as a cleaning member, supported by the tip end portion of the arm 91, a supporting member 95 for supporting the proximal end of the arm 91, and a driving device 96, built in the supporting member 95, for rotating and moving the arm 91 upward and downward.

The brush 92 is transplanted onto the brush base 93 and supported rotatably on the arm 91 via the shaft 94. Thus, the cleaning brush 92 is rotatable in the free state. As in the case of the brush 51 described above, the cleaning brush 92 is made of a resin such as polyvinyl carbon (PVC), and each piece of the brush has a diameter of, for example, about 0.2 mm. A cleaning solution supplying opening (not shown) is provided in the lower surface of the brush base 93, and the cleaning solution is supplied to the section of the semiconductor wafer W, which is brought into contact with the brush 92, via the supplying opening.

The arm 91 is rotated between a standby position and a cleaning position on the semiconductor wafer W, as indicated by a two-dot chain line shown in FIG. 13, by the driving device 96 via the shaft 97. At the standby position, the cleaning brush 92 is held by the cleaning brush cleaning device 98, in which the cleaning brush 92 is cleaned. In order for the rotation, the cleaning brush 92 is once lifted from the cleaning brush cleaning device 98 by the driving device 96, and moved downward above the semiconductor wafer W. Thus, the brush 92 is brought into contact with the surface of the semiconductor wafer W as can be seen in FIG. 12.

The ultrasonic water supplying mechanism 84 is provided on the opposite side of the cleaning portion 83 over the spin chuck 82 in the base of the main body 81, and consists of an arm 101, an ultrasonic water nozzle (megasonic nozzle) 102 provided on the distal end of the arm 101, a supporting portion 105 for supporting the proximal portion 19 of the arm 101, and a driving device (not shown), built in the supporting member 105, for rotating and moving the arm 101 upward and downward. The ultrasonic water nozzle 102 includes an ultrasonic wave generator (not shown), and the cleaning solution jetted from the nozzle by the ultrasonic generator is oscillated at a predetermined frequency.

The arm 101 is rotated between the standby position which is away from the spin chuck 82 and the supplying position above the semiconductor wafer W, by the driving means. At the standby position, the nozzle cleaning device 108 is held by the nozzle cleaning device 108, in which the nozzle 102 is cleaned. In order for the rotation, the ultrasonic water nozzle 102 is lifted from the nozzle cleaning device 108 by the driving mechanism, and adjusted to a position above the wafer W, at a level where the cleaning solution is supplied.

The cleaning nozzle 85 is provided outside the spin chuck 82, and designed to supply the cleaning solution (for example, pure water) to the surface of the semiconductor wafer W held and rotated by the spin chuck 82. The cleaning nozzle 85 is capable of switching its discharging direction.

The operation of the cleaning device 21 having the above-described structure will now be described.

First, a semiconductor wafer W is passed onto the spin chuck in the cleaning device 21 from the main arm 13 shown in FIG. 1, and the wafer is attracted and held thereon. After the wafer W is held thereon, the cleaning brush 92 is lifted from the cleaning brush cleaning device 98 by the driving device 96 of the cleaning section 83, and held above the center portion of the wafer W. During this period of time, the cleaning solution is supplied to the semiconductor wafer W on the spin chuck 82, from the nozzle 85, and then the spin chuck 82 is rotated by the motor 87. As the cleaning brush 92 is moved down from this state, by the driving device 96, the tip end of the cleaning brush 92 is brought into contact with the semiconductor wafer W, and the cleaning of the surface of the wafer W is started. During the cleaning, the cleaning brush 92 is rotated from the center portion towards the fringe portion of the wafer W by the driving mechanism 96.

In this case, the cleaning brush 92 serving as a cleaning member is provided rotatable in a free state with regard to the arm 91, and therefore by bringing the brush 92 into contact with the rotating semiconductor wafer W, the brush 92 is rotated in accordance with the rotation of the wafer W. Thus, the brush 92 rotates so as to follow up the rotation of the semiconductor wafer W, and therefore the damage caused by bringing the cleaning portion into contact with the semiconductor wafer W, can be suppressed.

After the cleaning by the cleaning brush 92, the arm 91 is rotated to the standby position, where the brush 92 is moved down to be contained in the cleaning brush cleaning device 98.

After that, the arm 101 of the ultrasonic water supplying mechanism 84 is rotated to a position above the semiconductor wafer W, and ultrasonic water is supplied from the nozzle 102 to the wafer W, thus carrying out the ultrasonic cleaning. After the ultrasonic cleaning, the arm 101 is returned to the standby position, and thus the ultrasonic water cleaning is finished. In accordance with necessity, the ultrasonic water cleaning is repeated.

When the cleaning is completed, the wafer W on the spin chuck 82 is carried onto another device by the main arm 13.

In this surface cleaning device 21, the cleaning brush 92 can be made rotatable by the stepping motor 99, as shown in FIG. 14, and the cleaning mode of the brush can be selected from the rotating state, the free state and the state in which the brush is not substantially rotated.

As described, according to the present invention, the cleaning member brought into contact with a substrate, is rotated in accordance with the rotation of the substrate, and the cleaning of the substrate is carried out in this manner. Therefore, the damage caused by the contact between the contact section of the brush and the substrate, can be suppressed, and foreign matters adhered on the substrate can be surely removed, thus making it possible to improve the yield of the substrate.

The present invention is not limited to the embodiment described above, but can be modified into different versions. For example, in the above embodiment, transplanted brush is used as the cleaning member; however, sponge, for example, may be used as the cleaning member. Further, the transplanted brush and the sponge can be used at the same time. Furthermore, the shape of the cleaning member is not limited to cylindrical.

Moreover, in the above embodiment, the rear surface cleaning device and the surface cleaning device are separately described; however, when the cleaning device is formed on both sides of a substrate to be processed, not only one surface, but also both surfaces can be cleaned at the same time, naturally improving the throughput. FIG. 15 shows an example of such a case. The cleaning device shown in this figure has both the cleaning section 31 of the rear surface cleaning device 20 shown in FIG. 2 and the cleaning section 83 of the surface cleaning device 21 shown in FIG. 12, and therefore both sides of a substrate can be cleaned at the same time. Further, it is only natural that the front and rear surfaces can be switched by flipping the substrate, so as to clean each surface.

In the above embodiment, a semiconductor wafer is used as the substrate to be processed; however the substrate may be a print substrate, a glass mask, an LCD substrate or the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cleaning method for scrubbing a surface of a substrate with a brush which rotates about an axis perpendicular to the substrate, while holding the substrate with a plurality of holding portions and rotating the substrate, the method comprising the steps of:

(a) providing a plurality of contact members each having a projecting stopper portion and a stepped portion for holding the substrate in such a way that a fringe of the substrate is held between the projecting stopper portion and the stepped portion of said plurality of contact members, wherein said contact members are disposed around the substrate and are movable in a radial direction with respect to the substrate, such that said contact members are urged against the fringe of the substrate to hold the substrate;

(b) holding the fringe of the substrate between the projecting stopper portions and stepped portions, such that a surface of the substrate to be scrubbed is disposed horizontally, and such that movement of the substrate from the contact members is prevented when a brush is brought into contact with the substrate while the substrate is rotating;

(c) placing at least one brush to face the substrate while said substrate is constrained by the contact members;

(d) spinning the contact members and the substrate; and (e) applying a cleaning solution to at least one side of the substrate and bringing a brush into contact with the at least one side to clean the at least one side.

2. The cleaning method according to claim 1, wherein in step (e), the cleaning solution is supplied to a rear side of said at least one brush and wherein said rear side is an upstream side of said brush with respect to a direction of rotation of said substrate relative to said brush, the method further including spraying a drying gas to a front side of said at least one brush and wherein said front side is a downstream side of said brush with respect to the direction of rotation of said substrate relative to said brush.

3. The cleaning method according to claim 1, wherein in step (e), a single brush is brought into contact with at least one side of the substrate and the brush is moved from a central portion of the substrate and to the fringe portion.

4. The cleaning method according to claim 1, wherein in step (c), a plurality of brushes are placed to face the substrate such that said brushes are arranged from a central portion of the substrate to the fringe portion, and in step (e) the brushes are brought into contact with at least one side of the rotating substrate.

5. The cleaning method according to claim 1, wherein in step (e) a cleaning solution is supplied to only an upper face of the substrate, and said at least one brush is brought into contact with the upper face.

6. The cleaning method according to claim 1, wherein in step (e) a cleaning solution is supplied to only a lower face of the substrate, and said at least one brush is brought into contact with the lower face.

7. The cleaning method according to claim 1, wherein in step (e) a cleaning solution is supplied to both an upper face and a lower face of the substrate, and a single brush is brought into contact with the upper face and a plurality of brushes are brought into contact with the lower face, so that the upper and lower faces are cleaned by the brushes.

8. The cleaning method according to claim 1, wherein in step (e), when the at least one brush is brought into contact with the rotating substrate, the at least one brush rotates as the substrate rotates.

9. The cleaning method according to claim 1, wherein said at least one brush is supported so as to be constrained and prevented from rotating around its axis, and in step (e), said brush which is constrained and prevented from rotating is brought into contact with the substrate.

10. The cleaning method according to claim 1, wherein said at least one brush is supported by driving means to be rotated around its axis, and in step (e), said brush is driven to rotate around an axis and brought into contact with the substrate.

11. The cleaning method according to claim 1, wherein in step (e), said brush is pressed onto the substrate at pressures between 20–150 gf.

12. A cleaning method for scrubbing a substrate, comprising the steps of:
   (a) holding the substrate by holding only a fringe of the substrate;
   (b) rotating the substrate; and
   (c) applying a cleaning solution to at least one side of the substrate, and bringing a brush which can freely rotate about a vertical axis into contact with the at least one side such that the brush rotates as a result of the rotation of the substrate, such that damage caused by bringing the brush into contact with the substrate is suppressed.

13. The cleaning method according to claim 12, wherein in step (c), the cleaning solution is applied on a surface of the substrate to be scrubbed at an upstream side of said brush, and a drying gas is blown on the scrubbed surface of the substrate at a downstream side of said brush.

14. The cleaning method according to claim 13, wherein the drying gas is blown on the substrate to flow in a radially outward direction.

15. A cleaning method for scrubbing a substrate, comprising the steps of:
   (a) holding the substrate by holding only a fringe of the substrate;
   (b) rotating the substrate;
   (c) applying a cleaning solution to at least one side of the substrate, and bringing a brush which can freely rotate about a vertical axis into contact with the at least one side such that the brush rotates as a result of the rotation of the substrate, such that damage caused by bringing the brush into contact with the substrate is suppressed; and
   (d) supplying a drying gas to the at least one side of the substrate.

16. The cleaning method according to claim 15, wherein in the step (c), the cleaning solution is applied on a surface of the substrate to be scrubbed at an upstream side of the brush, and in step (d) the drying gas is blown on the scrubbed surface of the substrate at a downstream side of said brush.

17. The cleaning method according to claim 15, wherein in step (d), the drying gas is blown on the substrate to flow in a radially outward direction.

* * * * *